US 6,547,650 B2
United States Patent
Inaba
Patent No.: US 6,547,650 B2
Date of Patent: Apr. 15, 2003

(54) POLISHING APPARATUS

(75) Inventor: Takao Inaba, Mitaka (JP)

(73) Assignee: Tokyo Seimitsu Co., Ltd., Tokyo (JP)

( * ) Notice: Subject to any disclaimer, the term of this patent is extended or adjusted under 35 U.S.C. 154(b) by 0 days.

(21) Appl. No.: 09/782,069

(22) Filed: Feb. 12, 2001

(65) Prior Publication Data

US 2001/0024937 A1 Sep. 27, 2001

(30) Foreign Application Priority Data

Mar. 23, 2000 (JP) .......................................... 2000-82978

(51) Int. Cl.[7] .................................................. B24B 7/00
(52) U.S. Cl. ............................ 451/67; 451/41; 451/339
(58) Field of Search ............................. 451/41, 54, 67, 451/339, 335

(56) References Cited

U.S. PATENT DOCUMENTS

| 5,329,732 A | | 7/1994 | Karlsrud et al. ............ 51/131.5 |
| 5,618,227 A | * | 4/1997 | Tsutsumi et al. ............ 451/288 |
| 5,827,110 A | | 10/1998 | Yajima et al. ................ 451/5 |
| 6,213,853 B1 | * | 4/2001 | Gonzalez-Martin et al. 451/287 |

FOREIGN PATENT DOCUMENTS

| EP | 0 648 575 | 4/1995 |
| EP | 0 761 387 | 3/1997 |
| EP | 0 827 809 | 3/1998 |
| EP | 0 975 009 | 1/2000 |
| GB | 2 324 750 | 11/1998 |
| WO | WO 99/51398 | 10/1999 |

OTHER PUBLICATIONS

Combined Search and Examination report dated Aug. 17, 2001 of corresponding British application.

* cited by examiner

Primary Examiner—Timothy V. Eley
Assistant Examiner—Alvin J Grant
(74) Attorney, Agent, or Firm—Christie, Parker & Hale, LLP

(57) ABSTRACT

In a wafer polishing apparatus 1 according to this invention, waiting units 43 having upper-lower two-stage wafer placement tables each for temporarily keeping a wafer from a load/unload unit 3 to a polishing head 42 or vice versa are provided to a polishing unit 4, and the upper/lower stage wafer placement tables can move individually. A spindle-washing unit 44 for washing polishing heads is disposed inside a lower space below the waiting units.

13 Claims, 6 Drawing Sheets

POLISHING APPARATUS

CROSS-REFERENCE TO RELATED APPLICATION

This application claims priority of Japanese patent application number 2000-82978, filed Mar. 23, 2000.

BACKGROUND OF THE INVENTION

1. Field of the Invention

This invention relates to a wafer polishing apparatus. More particularly, this invention relates to a polishing apparatus, for semiconductor wafers, using chemical mechanical polishing (CMP).

2. Description of the Related Art

Miniaturization of ICs (integrated circuits) has made progress in recent years, and IC patterns are being formed in multiple layers. A surface of the layer, on which such a pattern is formed, unavoidably has an unevenness to a certain extent. The prior art technology forms, as such, a pattern on the previous layer. The greater the number of layers and the smaller the widths of lines and the diameters of holes, the more difficult it becomes to form satisfactory patterns and the more likely it becomes for defects to occur. Therefore, it is a customary practice to planarize the surface of a layer having a pattern formed thereon and then to form the pattern of a next layer. A wafer polishing apparatus (CMP apparatus) using a CMP method has been employed for polishing a wafer during the formation of such an IC pattern.

In the wafer polishing apparatus according to the prior art described above, the steps of adsorbing a wafer one by one by a head from a cassette storing it, polishing and washing of the wafer, removing of the wafer from the head and accommodating of the wafer into the cassette, have been carried out batch-wise. Therefore, the conventional wafer polishing apparatus involves the problem of low through-put, hence low productivity.

SUMMARY OF THE INVENTION

In view of the problem described above, it is therefore an object of the present invention to provide a wafer polishing apparatus having improved through-put and high productivity.

A wafer polishing apparatus according to the present invention improves through-put by providing waiting units having wafer placement tables of an upper-lower two-stage structure for temporarily placing a wafer, capable of sliding individually, to a polishing unit.

A wafer polishing apparatus according to another embodiment of the invention uses an upper-stage wafer placement table of a waiting unit for a loading-only table and a lower-stage wafer placement table of the waiting unit for an unloading-only table.

In a wafer polishing apparatus according to still another embodiment of the present invention, when an upper-stage wafer placement table reaches a position at which a wafer is delivered to a polishing head, the wafer placement table is communicated with a feed water pipe so that the wafer can float up on the wafer placement table and the polishing head can easily hold the wafer.

In a wafer polishing apparatus according to still another embodiment of the invention, a washing unit comprising a ring-like brush and a water injection nozzle for washing a wafer holding surface of a polishing head is provided to a polishing unit. Therefore, the polishing head can be washed every time the wafer is polished, scratches on the wafer due to adhesion of dust can be prevented, and high precision planarization polishing can be conducted.

In a wafer polishing apparatus according to still another embodiment of the invention, a washing unit is disposed in a space below a position at which the wafer held by a wafer placement table of a waiting unit is delivered to a polishing head. Therefore, the installation space of the washing unit can be saved, and the polishing unit can be rendered compact.

In a wafer polishing apparatus according to still another embodiment of the invention, a ring-like brush and a wafer holding surface of a polishing head as a surface to be washed are arranged eccentrically relative to each other, so that relatively unmovable portions (unwashed portions) between the ring-like brush and the to-be-washed surface can be eliminated, and washing can be conducted sufficiently.

In a wafer polishing apparatus according to still another embodiment of the invention, a washing unit of a wafer holding surface of a polishing head and waiting units having upper-lower two-stage structure and capable of sliding individually are provided to a polishing unit. Therefore, through-put can be improved, and high precision planarization polishing can be conducted.

The present invention may be more fully understood from the description of a preferred embodiment of the invention set forth below together with the accompanying drawings.

DESCRIPTION OF THE PREFERRED EMBODIMENT

A wafer polishing apparatus according to a preferred embodiment of the present invention is now explained with reference to the accompanying drawings.

Figure 1:
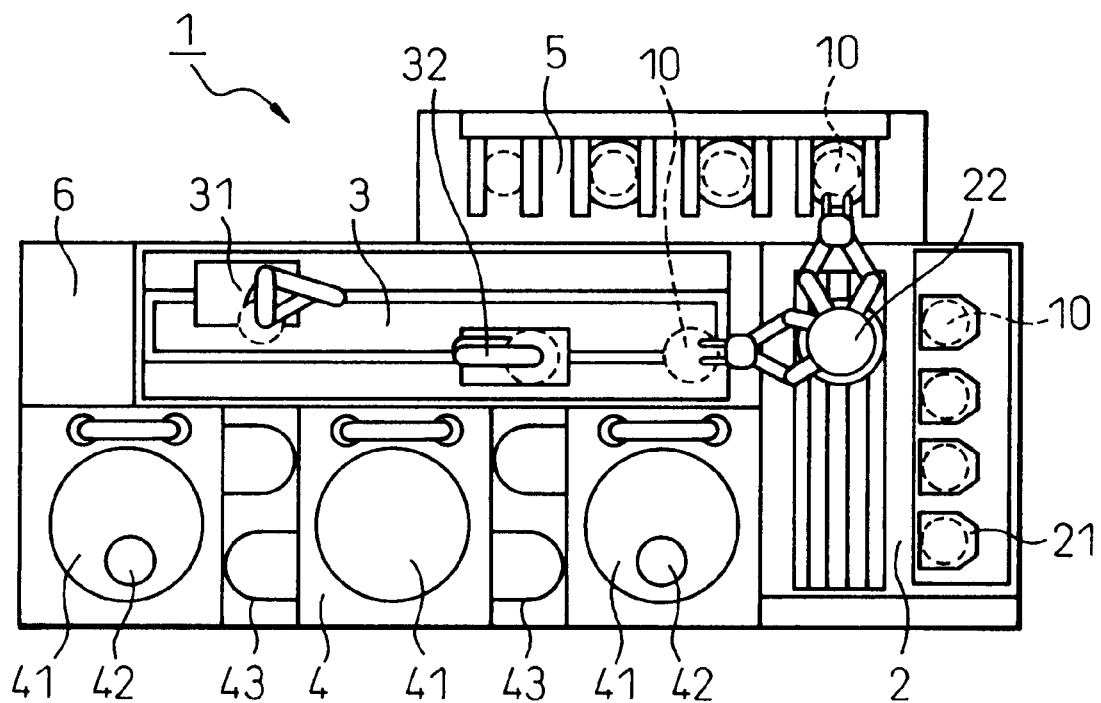
FIG. 1 is a schematic plan view of an overall construction of a wafer polishing apparatus according to an embodiment of the present invention.

FIG. 1 is a schematic plan view showing an overall construction of a wafer polishing apparatus according to the present invention. The wafer polishing apparatus 1 comprises five units, that is, an index unit 2, a load/unload unit 3, a polishing unit 4, a washing unit 5 and an electric installation unit 6. Fitting devices individually fit each of these units.

The index unit 2 is constituted so that a plurality of cassettes 21 can be loaded. A robot 22 is fitted to the index unit 2 so as to take out the wafers 10 accommodated in the cassettes 21 and to carry them to the load/unload unit 3. The robot 22 receives the wafers 10 after polishing and washing from the washing unit 5 and returns them into the respective cassettes 21.

The load/unload unit 3 includes upper and lower, two transfer robots 31 and 32. The upper stage transfer robot 31 is used for loading while the lower stage transfer robot 32 is used for unloading. Each wafer 10 from the index unit 2 is delivered to an arm 33 of the upper stage transfer robot 31. A pre-alignment table inside the load/unload unit 3, not shown, executes centering, and the wafer 10 is then conveyed to the polishing unit 4.

The polishing unit 4 includes three platens 41 and two polishing heads 42. A waiting unit 43 having a wafer placement table having an upper-lower two-stage structure is disposed between the respective platens. Each wafer 10 conveyed to the polishing unit 4 is carried by the polishing heads 42 to the platens 41 through the waiting unit 43 and is polished there. After polishing, the wafer 10 is taken out by the lower stage transfer robot 32 of the load/unload unit 3 again through the waiting unit 43, and is then conveyed to the washing unit 5.

After washing is complete, the robot 22 of the index unit 2 accommodates the wafer 10 into the cassette 21. The above explains the outline of the processing steps of the wafer polishing apparatus 1 shown in FIG. 1.

Next, the construction of the polishing unit 4 as the feature of the wafer polishing apparatus of the present invention is explained in detail with reference to FIGS. 2 to 7.

The polishing unit 4 includes the three platens 41 and the two polishing heads 42 as described above. Both of the right and left platens 41 use the same kind of slurry, and the center platen uses a different kind of slurry so that the polishing characteristics can be changed. The polishing heads 42 for holding the wafer 10 can linearly move between the platens and can also move up and down.

Furthermore, the polishing unit 4 is equipped with two waiting units 43 between the respective pairs of platens 41. Each waiting unit 43 has a wafer placement table of an upper-lower two-stage structure.

Figure 2:
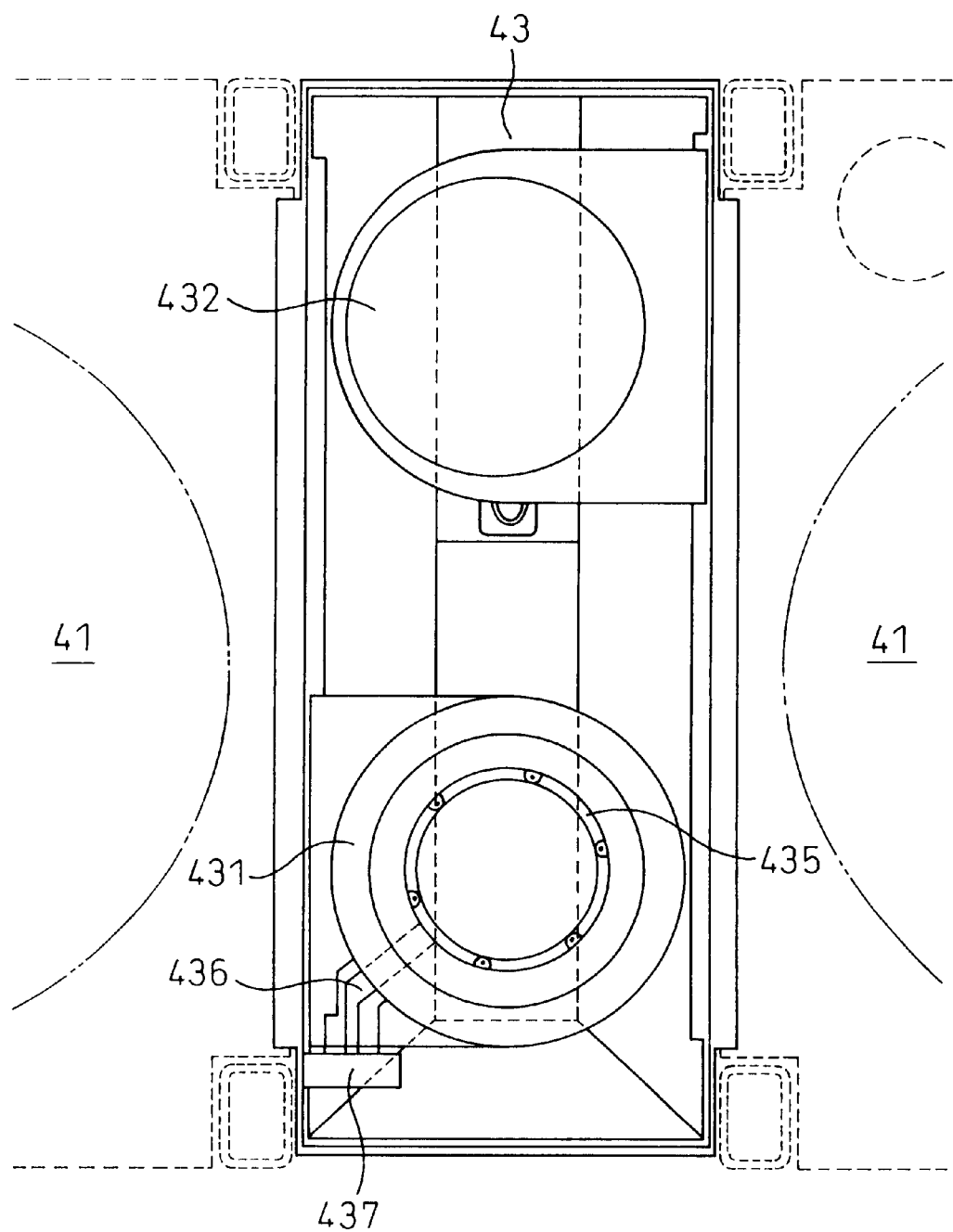
FIG. 2 is a plan view of a waiting unit having an upper-lower two-stage structure as a part of a polishing unit of the wafer polishing apparatus according to the present invention.
Figure 3:
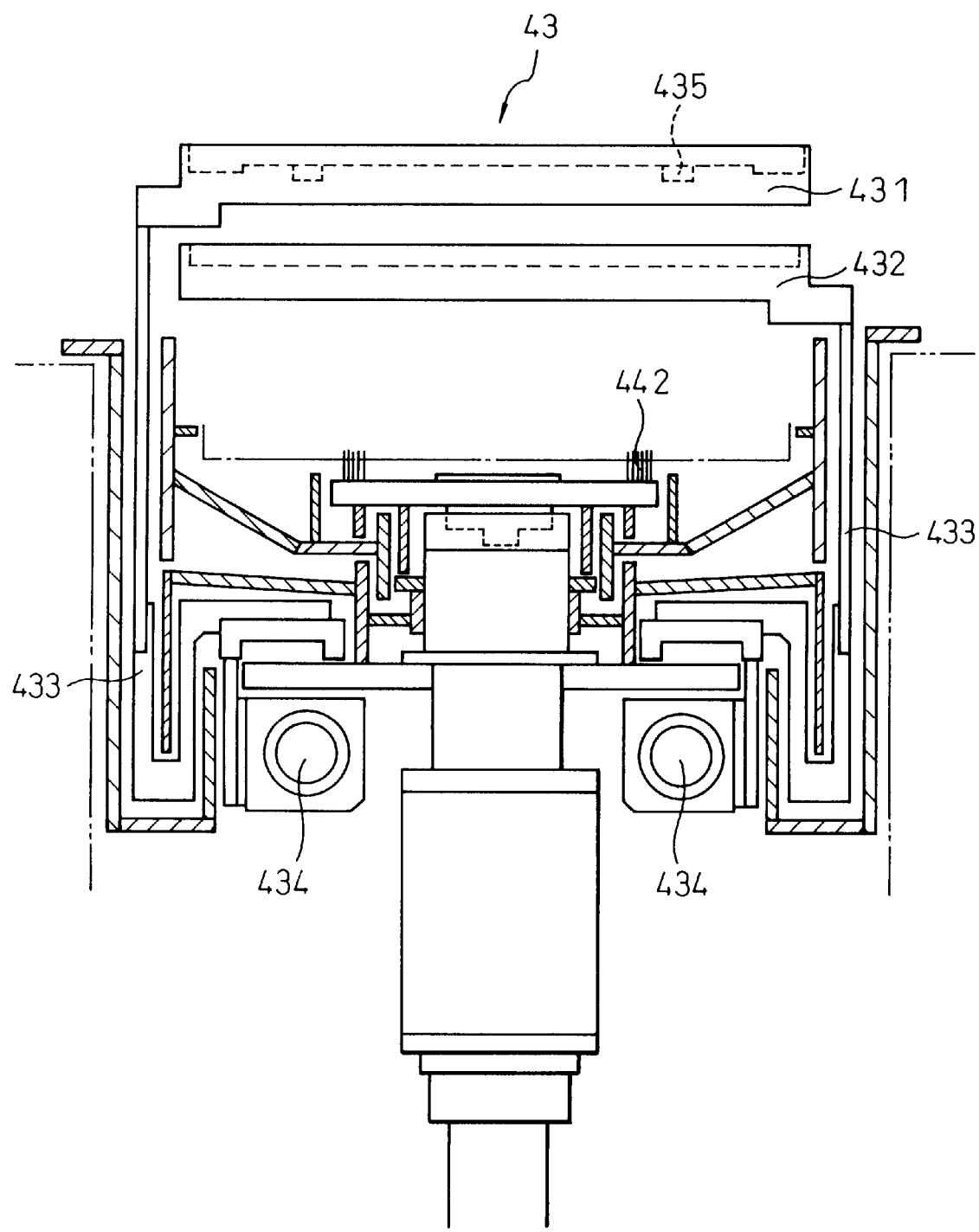
FIG. 3 is a longitudinal sectional view of the waiting unit having the upper-lower two-stage structure shown in FIG. 2.
Figure 4:
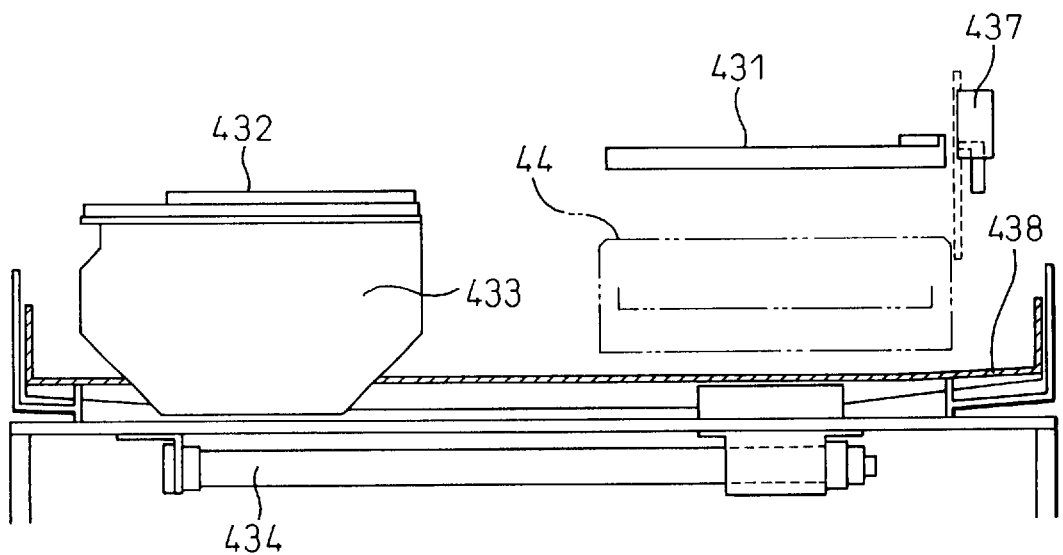
FIG. 4 is a side view of the waiting unit having the upper-lower two-stage structure shown in FIG. 2.

As shown in FIGS. 2 and 3, each waiting unit 43 includes wafer placement tables 431 and 432 of upper and lower stages. Each wafer placement table is connected to a rod-less cylinder 434 through an interconnecting member 433. Therefore, the wafer placement tables 431 and 432 can move linearly when the rod-less cylinder 434 drives them.

A ring-like groove 435 is formed on the surface of the upper-stage wafer placement table 431. A feed water passage 436 is so disposed inside the upper-stage wafer placement table 431 as to communicate with the groove 435, and is connected to a feed water valve 437 disposed on the waiting unit 43 when the wafer placement table 431 moves to the load position. Therefore, when the wafer 10 is placed on the upper-stage wafer placement table 431 and reaches the load position at which the polishing head 42 holds the wafer 10, water flows out from the groove of the wafer placement table 431 and supports the wafer 10. In consequence, the polishing head 42 can easily hold the wafer 10. Incidentally, the lower-stage wafer placement table 432, too, may have the same construction, and the rod-less cylinder 434 may have a known construction.

Figure 6:
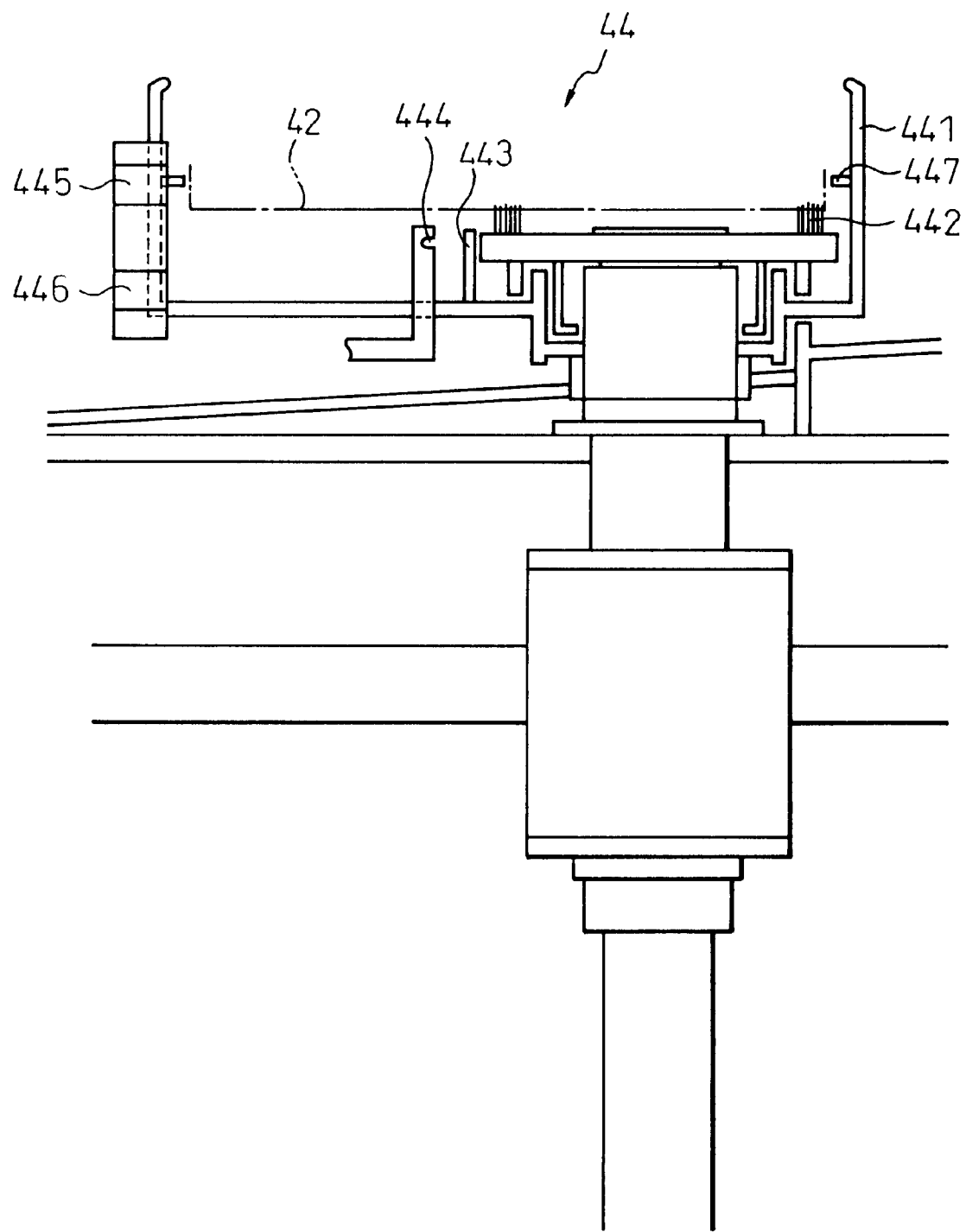
FIG. 6 is a longitudinal sectional view of the spindle-washing unit provided to a lower portion of the waiting unit according to the present invention.
Figure 7:
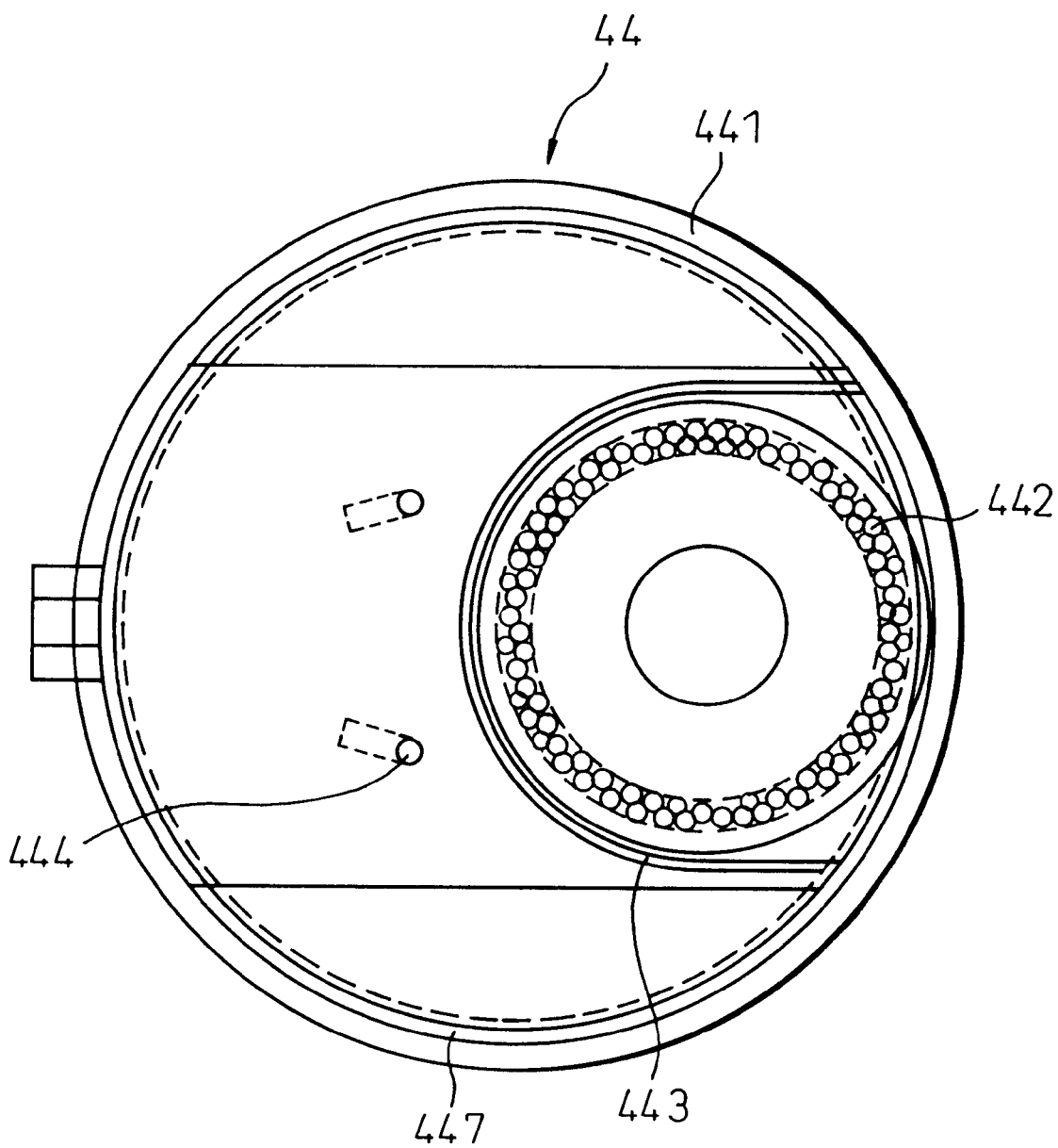
FIG. 7 is a plan view of the spindle-washing unit shown in FIG. 6.

A spindle-washing unit 44 shown in FIGS. 6 and 7 is provided to the polishing unit 4. The spindle-washing unit 44 is disposed at a lower part of the traveling path of the wafer placement table 431 in superposition with the waiting unit 43, as can be seen from FIG. 3, in order to save installation space. In other words, a circular tank 441 having a size sufficient enough for the polishing head 42 as the spindle to enter is disposed below the lower-stage wafer placement table 432 at the load position of the wafer placement table 431. A circular brush 442, the diameter of which is about a half that of the tank 441, is disposed eccentrically relative to the tank 441, inside this tank 441. A partition wall 443 that is lower than the height of the brush 442 is further disposed inside the tank 441 in such a manner as to partition the brush portion 442. The tank 441 includes therein a plurality of injection nozzles 44 for injecting water to the washing surface of each polishing head 42 by the brush 442. The tank 441 has a water feed port 445 and a water drain port 446 round its outer periphery, and a plurality of ring-like guide members 447 for guiding the polishing heads 42 on its inner peripheral surface.

Figure 5:
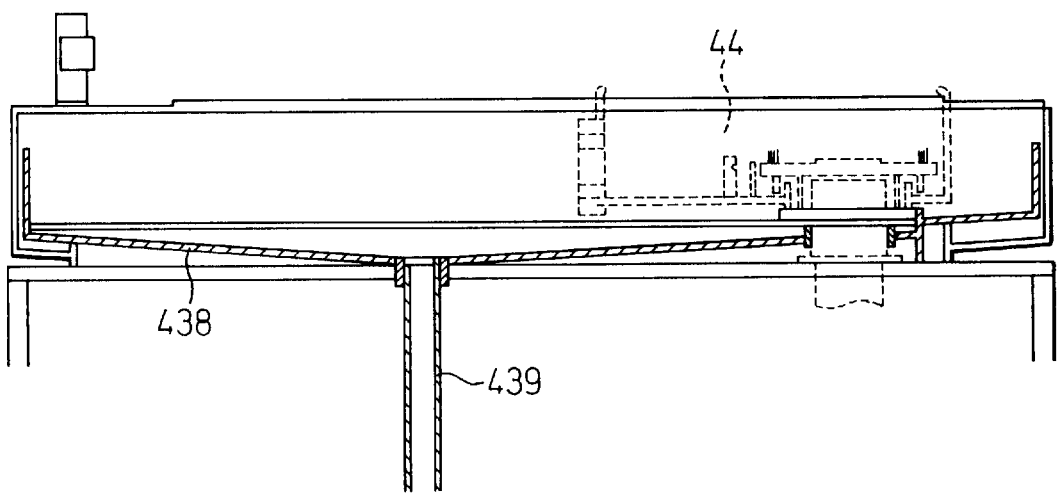
FIG. 5 is an explanatory view useful for explaining a positional relationship between a spindle-washing unit of the waiting unit and a water container.

A water container 438 for finally accommodating washing water is disposed below the waiting unit 43 of the polishing unit 4 as shown in FIG. 5, and is connected at its substantial center to a drain pipe 439.

The polishing unit 4 of the wafer polishing apparatus according to the present invention having the construction described above operates in the following way.

Each wafer 10 conveyed from the load/unload unit 3 to the polishing unit 3 is first put on the upper-stage wafer placement table 431 of the waiting unit 43. Next, the rod-less cylinder 434 operates and moves the wafer placement table 431, conveying the wafer 10 to the position (load position) at which the wafer 10 is delivered to the polishing head 42. At this time, the wafer placement table 431 is connected to the water feed valve 437 provided to the waiting unit 43, and water flows out from the surface of the wafer placement table 431 supporting thereon the wafer 10 and lifts up the wafer 10. Each polishing head 42 lowers under this state, adsorbs and holds the wafer 10, and carries the wafer 10 onto the platen 41, where wafer 10 is polished.

After bringing down the wafer 10, the upper-stage wafer placement table 431 returns to its original position and enters the stand-by state for accepting the next wafer 10. Similarly, the rod-less cylinder 434 operates and moves the lower-stage wafer placement table 432 of the waiting unit, and the lower-stage wafer placement table 432 stops at the position (unload position) at which it receives the polished wafer 10 from the polishing head 42. Receiving the polished wafer 10 from the polishing head 42, the lower-stage wafer placement table 432 returns to its original position. The polished wafer 10 is carried to the load/unload unit 3, and is then conveyed to the next washing unit 5.

After delivering the wafer 10 to the lower-stage wafer placement table 432, the polishing head 42 lowers until its surface comes into contact with the circular brush 442 of the spindle-washing head 44 after the lower-stage wafer placement table 432 moves, and the polishing head 42 is washed. The injection nozzle 444 injects washing water during washing. The polishing head 42 so washed can hold the next wafer 10 at the same position.

One cycle of the operation in the polishing unit 4 is conducted in this way. The same operation is conducted in another waiting unit 43.

As described above, the wafer polishing apparatus according to the present invention includes the upper and lower two-stage structure waiting units for temporarily placing the wafers to the polishing unit, and can therefore improve through-put and productivity.

When the wafer placement table delivers the wafer to the polishing head, the wafer is supported water. Consequently, the polishing head can easily hold the wafer. Furthermore, since the spindle-washing unit is disposed below the waiting unit, the wafer polishing apparatus can be rendered compact. Because the apparatus can accept the wafer at the same position, it can operate smoothly without idle time. Because the polishing head is washed whenever the wafer is polished, the wafer polishing apparatus can conduct high precision planarization polishing.

While the present invention has thus been described by reference to a specific embodiment chosen for purposes of illustration, it should be apparent that numerous modifications could be made thereto by those skilled in the art without departing from the basic concept and scope of the invention.

What is claimed is:

1. A wafer polishing apparatus including an index unit for delivering a wafer from a cassette to a loal/unload unit, said load/unload unit for relaying said wafer from said index unit to a polishing unit and from said polishing unit to a washing unit, said polishing unit for polishing said wafer and said washing unit for washing said wafer after polishing, wherein:
    waiting units each including a wafer placement table having an upper/lower two-stage structure, for temporarily placing said wafer transferred from said load/unload unit to said polishing head or from said polishing head to said load/unload unit, are provided to said polishing unit, and both of said upper-stage and lower-stage wafer placement tables can slide individually.

2. A wafer polishing apparatus according to claim 3, wherein said upper-stage wafer placement of said waiting unit communicates with a feed water pipe upon reaching a position at which said wafer placement table delivers said wafer placed thereon to said polishing head, forms a film of water on said upper-stage wafer placement table of said waiting unit, and supports said wafer.

3. A wafer polishing apparatus according to claim 1, wherein said upper-stage wafer placement table of said waiting unit is a loading-only table for delivering said wafer to said polishing head, and said lower-stage wafer placement table of said waiting unit is an unloading-only table for receiving said wafer after polishing from said polishing head.

4. A wafer polishing apparatus including an index unit for delivering a wafer from a cassette to a load/unload unit, said load/unload unit for delivering said wafer from said index unit to a polishing unit and from said polishing unit to a washing unit, said polishing unit for polishing said wafer, and said washing unit for washing said wafer after polishing, wherein:
    said polishing unit includes a spindle-washing unit comprising an annular brush and a water injection nozzle for washing a wafer holding surface of said polishing head.

5. A wafer polishing apparatus according to claim 4, wherein said washing unit is disposed inside a space below a position at which said wafer held on said wafer placement table fo said waiting unit is delivered to said polishing head.

6. A wafer polishing apparatus according to claim 5, wherein a waiting unit having wafer placement tablers having an upper-lower two-stage structure and capable of individually sliding is further provided to said polishing unit.

7. A wafer polishing apparatus according to claim 4, wherein said annular brush and said wafer holding surface are eccentric with each other so that said annular brush exists at the center of said wafer holding surface of said polishing head at the time of washing.

8. A wafer polishing apparatus according to claim 1, wherein said upper stage wafer placement table is slideable from a first position to a second position and said lower stage wafer placement table is slideable from a third position to a fourth position.

9. A wafer washing apparatus according to claim 5, wherein said annular brush and said wafer holding surface are eccentric with each other so that said annular brush exists at the center of said wafer holding surface of said polishing head at the time of washing.

10. A wafer washing apparatus according to claim 9, wherein a waiting unit having wafer placement tables having an upper-lower two-stage structure and capable of individually sliding is further provided to said polishing unit.

11. A wafer polishing apparatus according to claim 4, wherein said annular brush contacts said wafer holding surface of said polishing head.

12. A wafer polishing apparatus according to claim 1, wherein said upper-stage wafer placement table of said waiting unit communicates with a feed water pipe upon reaching a position at which said wafer placement table delivers said wafer placed thereon to said polishing head, forms a film of water on said upper-stage wafer placement table of said waiting unit, and floats up said wafer.

13. A wafer polishing apparatus according to claim 4, wherein a waiting unit having wafer placement tables an upper-lower two-stage structure and capable of individually sliding is further provided to said polishing unit.

* * * * *